United States Patent
Kawamatsu et al.

(10) Patent No.: US 6,438,449 B2
(45) Date of Patent: Aug. 20, 2002

(54) SUBSTRATE TRANSPORT APPARATUS AND TRANSPORT TEACHING SYSTEM

(75) Inventors: Yasuo Kawamatsu; Yoshihiko Watanabe, both of Kyoto; Yasuhiko Hashimoto, Hyogo, all of (JP)

(73) Assignees: Dainippon Screen Mfg. Co., Ltd.; Kawasaki Jukogyo Kabushiki Kaisha, both of (JP)

( * ) Notice: Subject to any disclaimer, the term of this patent is extended or adjusted under 35 U.S.C. 154(b) by 70 days.

(21) Appl. No.: 09/725,553

(22) Filed: Nov. 29, 2000

(30) Foreign Application Priority Data

Nov. 29, 1999 (JP) ............................................ 11-337393

(51) Int. Cl.[7] .......................... G06F 7/00; G05B 19/04; G05B 19/18; B25J 19/00
(52) U.S. Cl. ...................... 700/229; 700/253; 414/730; 901/47
(58) Field of Search ............................... 700/229, 245, 700/253, 254; 901/47; 414/730, 941

(56) References Cited

U.S. PATENT DOCUMENTS

| | | | | |
|---|---|---|---|---|
| 4,460,826 A | * | 7/1984 | Pryor | 901/47 |
| 4,753,569 A | * | 6/1988 | Pryor | 700/250 |
| 5,219,264 A | * | 6/1993 | McClure et al. | 414/730 |
| 5,946,409 A | * | 8/1999 | Hori | 382/149 |
| 6,021,363 A | * | 2/2000 | Nishikawa et al. | 700/253 |
| 6,206,441 B1 | * | 3/2001 | Wen et al. | 901/46 |
| 6,298,280 B1 | * | 10/2001 | Bonora et al. | 414/941 |
| 6,359,207 B1 | * | 3/2002 | Oba et al. | 84/20 |

FOREIGN PATENT DOCUMENTS

| | | |
|---|---|---|
| FR | 2664525 | 1/1992 |
| JP | 62-140735 | 9/1987 |

OTHER PUBLICATIONS

European Search Report issued Mar. 6, 2001 in a related application.
Patent Abstracts of Japan, vol. 1999, No. 12, Oct. 29, 1999 & JP 11–186360 a (Dainippon Screen Mfg. Co. Ltd.; Kawasaki Heavy Ind. Ltd.), Jul. 9, 1999, *abstract; figures 4,9,10,12*.

* cited by examiner

*Primary Examiner*—Christopher P. Ellis
*Assistant Examiner*—Gene O Crawford
(74) *Attorney, Agent, or Firm*—Ostrolenk, Faber, Gerb & Soffen, LLP

(57) ABSTRACT

To provide a substrate transport device and a transport teaching system which can automatically perform a teaching processing in order to reduce the burden of an operator and to eliminate a positional shift accurately and efficiently in a short time. Optical connectors 251, 252, 253 and 254 of a jig 200 and optical connectors 256, 257, 258 and 259 fixedly provided on a substrate transport device are opposed to each other and optical axes are coincident with each other. A lens having a high condensation ratio is provided in each optical connector. A light signal is output from optical sensor heads 231 and 241 through an optical fiber F2, each optical connector and an optical fiber F1, and a light signal input to optical sensor heads 232 and 242 is guided into the substrate transport device. Then, an arm 31b is automatically moved in a three-axis direction. Thus, an edge position of a detected portion 122 is detected to acquire positional information so that teaching information is obtained.

9 Claims, 10 Drawing Sheets

SUBSTRATE TRANSPORT APPARATUS AND TRANSPORT TEACHING SYSTEM

BACKGROUND OF THE INVENTION

1. Field of the Invention

The present invention relates to a transport device and a transport teaching system which are used for teaching a transporting position when transporting a thin plate-shaped substrate (which will be hereinafter referred to as a "substrate") such as a semiconductor wafer, a glass substrate for a liquid crystal, a glass substrate for a photomask or a substrate for an optical disk.

2. Description of the Background Art

Conventionally, a plurality of processing parts have been provided on a substrate processing apparatus for. processing the above-mentioned substrates. The processing parts perform different processings for the substrates to be processed. Such a conventional substrate processing apparatus has been provided with a substrate transport device for transporting the substrate between the processing parts.

Such a substrate transport device should transport a substrate to an accurate position for a predetermined delivery portion in each processing part. If the substrate cannot be transported to the accurate position, there is a possibility that processing unevenness might be caused on the substrate, the substrate might fall off from the delivery portion and unnecessary particles might be stuck, which is not preferable.

Actually, an arm of the substrate transport device does not access an accurate transporting position to cause a positional shift due to various errors such as a processing error of a member constituting the arm holding the substrate, a mounting error caused by mounting each member or an assembly error caused by assembling the substrate transport device.

In order to eliminate the positional shift caused by such an error or the like, a teaching (transport teaching) work for the substrate transport device is performed by an operator prior to the actual delivery of the substrate.

After the substrate processing apparatus is operated for a constant period, the operator sometimes removes the arm from a substrate transport robot to wash the arm. In such a case, every time the arm is washed, it should be attached again and a mounting error is made so that a positional shift is generated. In the conventional substrate processing apparatus, accordingly, the operator should perform the teaching work for each maintenance such as the washing operation of the arm.

In the teaching work of the arm in the conventional substrate processing apparatus described above, the operator should visually perform adjustment while moving the arm little by little. Therefore, the teaching work is very complicated and takes time. Moreover, a great difference is made to the precision depending on the experience and technical capabilities of the operator for performing the teaching work.

Accordingly, the teaching work is burden to the operator and takes time and the precision has a variation, which is not preferable because the substrate processing apparatus should be operated efficiently and accurately.

SUMMARY OF THE INVENTION

The present invention is directed to an apparatus for transporting a substrate.

A first aspect of the present invention is directed to an apparatus for transporting a substrate comprising an arm provided to be moved forward and backward with respect to a body portion of the apparatus and capable of holding a substrate, an optical connector for emitting light which is fixedly provided in the apparatus body portion, an optical connector for receiving light which is fixedly provided in the apparatus body portion. a light emitting part provided in the apparatus body portion for transmitting a first light signal to the optical connector for emitting light, a light receiving part provided in the apparatus body portion for receiving a second light signal from the optical connector for receiving light, an optical fiber for emitting light which serves to transmit the first light signal between the optical connector for emitting light and the light emitting part, and an optical fiber for receiving light which serves to transmit the second light signal between the optical connector for receiving light and the light receiving part.

By causing the arm of the apparatus to hold the teaching jig, the burden of an operator can be lightened, automatic teaching for eliminating a positional shift accurately and efficiently in a short time can be performed, and a weight of the arm can be reduced. Thus, the automatic teaching can be performed with higher precision. Moreover, the optical connector is fixedly provided in the body portion of the apparatus. Therefore, the optical fiber is not deteriorated due to bending even if the arm is moved forward and backward, and a space required for the bending does not need to be secured.

Furthermore, the present invention is also directed to a transport teaching system for teaching a transporting position of a substrate to the substrate transport device for transporting a substrate.

A second aspect of the present invention is directed to a transport teaching system for teaching a transporting position of a substrate, comprising a) a substrate transport device including, an arm provided to be moved forward and backward with respect to a body portion of the device and capable of holding a substrate, a first optical connector for emitting light which is fixedly provided in the device body portion, a first optical connector for receiving light which is fixedly provided in the device body portion, a light emitting part provided in the device body portion for transmitting a first light signal to the first optical connector for emitting light, a light receiving part provided in the device body portion for receiving a second light signal from the first optical connector for receiving light, an optical fiber for emitting light which serves to transmit the first light signal between the first optical connector for emitting light and the light emitting part, and an optical fiber for receiving light which serves to transmit the second light signal between the first optical connector for receiving light and the light receiving part, b) a jig capable of being held in the arm including an optical sensor head for detecting a predetermined detected portion provided in the transporting position with a non-contact, and a second optical connector for emitting light and a second optical connector for receiving light which are connected to an optical fiber extended from the optical sensor head, c) a moving control part for causing the arm to hold the jig and for moving the arm to detect the detected portion provided in the transporting position through the optical sensor head in a state in which light is emitted and received between the first optical connector for emitting light and the second optical connector for receiving light and between the first optical connector for receiving light and the second optical connector for emitting light, and d) a teaching information acquiring part for acquiring teaching information about the transporting position from positional information about the detected portion detected by the optical sensor head.

The burden of the operator can be lightened, automatic teaching for eliminating a positional shift accurately and efficiently in a short time can be performed, and the automatic teaching can be performed with high precision. Moreover, the optical connector is fixedly provided in the body portion of the substrate transport device. Therefore, the optical fiber is not deteriorated due to bending even if the arm is moved forward and backward, and a space required for the bending does not need to be secured.

In a preferred embodiment of the present invention, the first optical connector for emitting light and the first optical connector for receiving light in the substrate transport device are provided on a holding table fixed to the device body portion.

Therefore, it is an object of the present invention to provide a substrate transport apparatus and a transport teaching system which can automatically perform a teaching processing in order to reduce the burden of an operator and to eliminate a positional shift accurately and efficiently in a short time.

These and other objects, features. aspects and advantages of the present invention will become more apparent from the following detailed description of the present invention when taken in conjunction with the accompanying drawings.

DESCRIPTION OF THE PREFERRED EMBODIMENTS

1. Structure of Substrate Processing Apparatus

Figure 1:
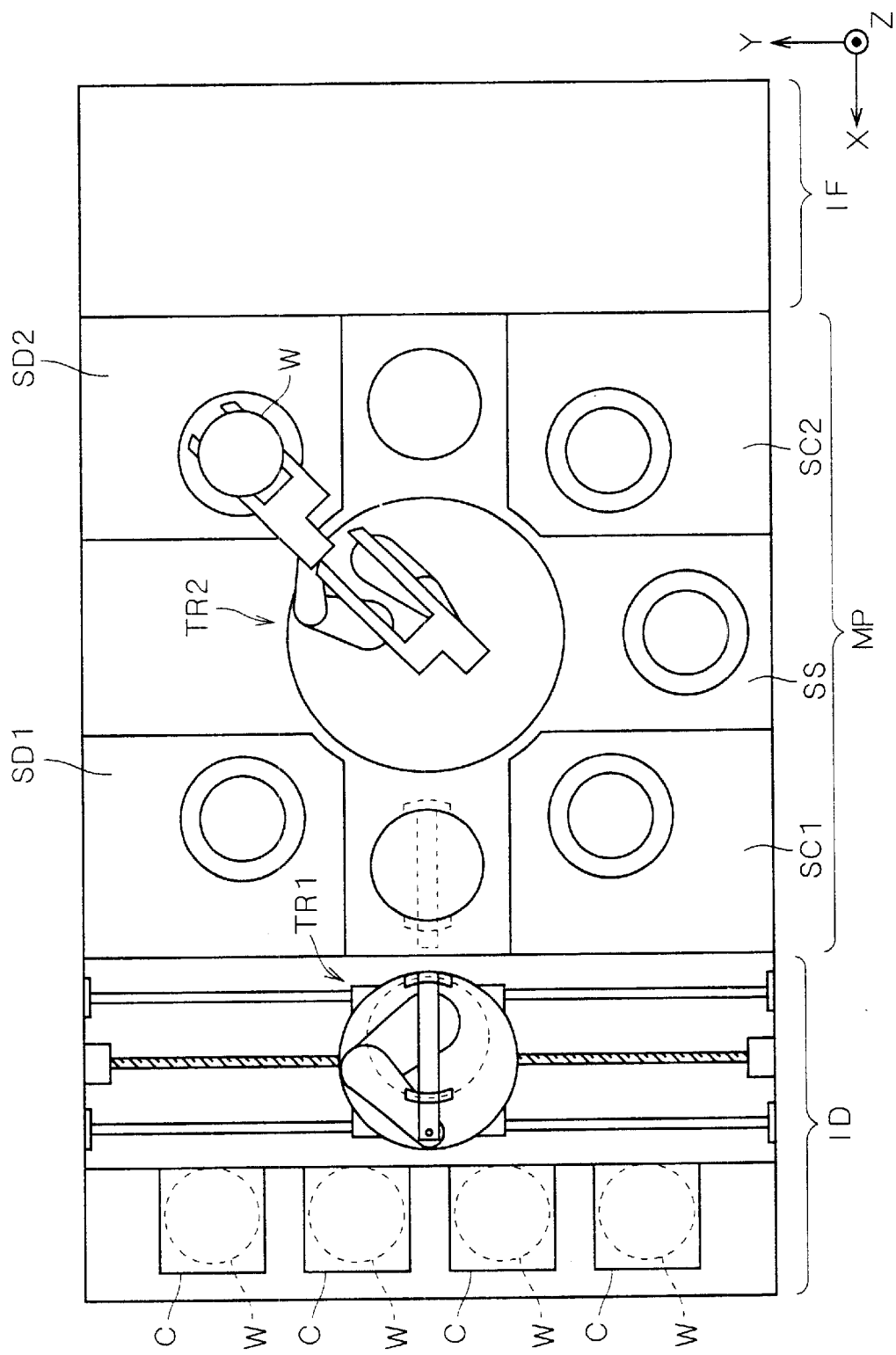
FIG. 1 is a schematic plan view showing a substrate processing apparatus according to an embodiment of the present invention.

First of all, the whole structure of a substrate processing apparatus according to the present invention will be described. FIG. 1 is a schematic plan view showing the substrate processing apparatus according to an embodiment.

As shown in FIG. 1, the substrate processing apparatus comprises an indexer ID, a unit arrangement part MP and an interface IF in the present embodiment.

The indexer ID is provided with a substrate transport device TR1 for transporting a substrate W. The substrate transport device TR1 takes the substrate W out of a carrier C acting as a housing container and transports the substrate W to the unit arrangement part MP, and receives the substrate W subjected to a predetermined processing from the unit arrangement part MP and accommodates the substrate W in the carrier C.

The unit arrangement part MP is provided, on four corners, coating units SC1 and SC2 (spin coaters) for performing a resist coating treatment while rotating the substrate and developing units SD1 and SD2 (spin developers) for performing a development treatment for the exposed substrate as liquid treating units for performing a treatment with a treating solution on the substrate. A washing unit SS (spin scrubber) for supplying a washing solution such as pure water to the substrate and rotating and washing the substrate is provided between the coating units SC1 and SC2. Furthermore, the upper side of the liquid treating unit is provided with a plurality of heat treating units for performing a heat treatment, for example, a cool plate part for cooling the substrate, a hot plate part for performing a heat treatment and the like, which are not shown. A substrate transport device TR2 is provided in a central part of the unit arrangement part MP. The substrate transport device TR2 sequentially transports the substrate W between the liquid treating unit and the heat treating unit so that the substrate W is subjected to a predetermined treatment. The liquid treating unit and the heat treating unit will be generally referred to as treating units.

The interface IF is provided to transfer the substrate subjected to resist coating to the exposing device side which is not shown and to receive the exposed substrate from the exposing device side in the unit arrangement part MP.

In order to apply the present invention, the substrate transport device is not restricted. For convenience of explanation, description will be given to the case in which automatic teaching is performed for a position to which the substrate transport device TR2 is to transport the substrate.

2. Concept of Automatic Teaching and Premise in Embodiment

First of all, the concept of the automatic teaching will be described. When the teaching processing of the substrate transport device TR2 is to be performed automatically, a detected portion to be a reference is first provided in a predetermined transporting position. Then, a jig including a sensor capable of detecting the detected portion with a non-contact is set into an arm of the substrate transport device TR2. Then, the substrate transport device TR2 is driven such that the jig set into the arm has a predetermined positional relationship with the detected portion.

Figure 2:
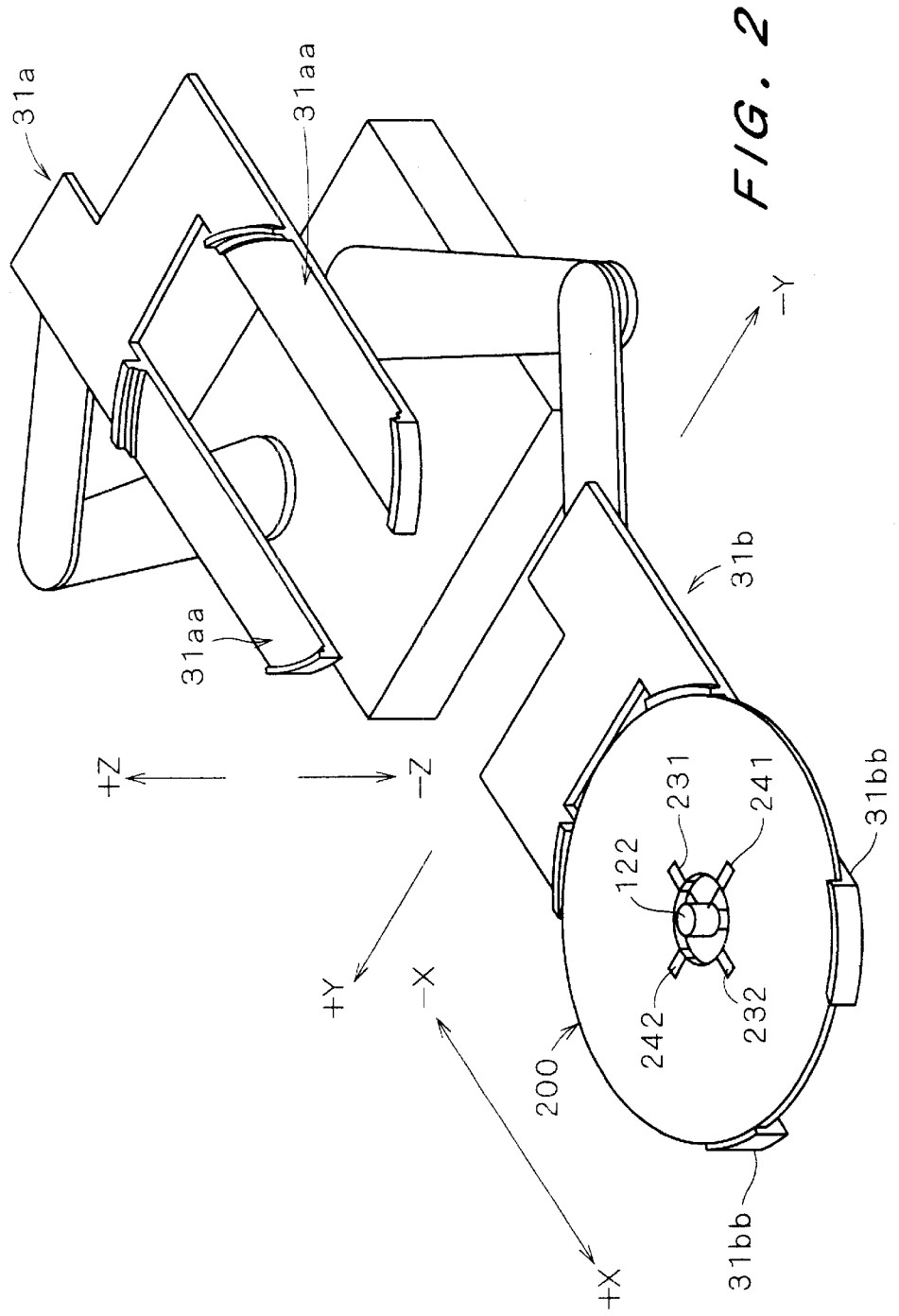
FIG. 2 is a view illustrating a concept of automatic teaching.

This state is shown in FIG. 2. As shown in FIG. 2, a jig 200 is set into an arm 31b. The jig 200 has a circular hole formed in a central part thereof. A detected portion 122 to be a reference is inserted movably in the hole. Optical sensor heads 231, 232, 241 and 242 are provided to detect the detected portion 122. The optical sensor heads 231 and 232 make a set to detect the detected portion 122 in a Y-axis direction, and the optical sensor heads 241 and 242 make a set to detect the detected portion 122 in an X-axis direction. Optical axes of the optical sensor heads 231 and 232 are almost orthogonal to those of the optical sensor heads 241 and 242.

When the arm 31b is moved in +X and −X directions in such a state, an edge part of the detected portion 122 for an X axis can be detected by the optical sensor heads 241 and 242. Moreover, when the arm 31b is moved in +Y and −Y directions, an edge part of the detected portion 122 for a Y axis can be detected by the optical sensor heads 231 and 232.

Furthermore, when the arm 31b is moved in +Z and −Z directions, an edge part of the detected portion 122 for a Z axis can be detected by the optical sensor heads 231 and 232 or the optical sensor heads 241 and 242.

The detected portion 122 is provided in a central position of the predetermined transporting position. By guiding a central position of two edge parts for the X axis, a reference position for the X axis can be obtained. By guiding a central position of two edge parts for the Y axis, a reference position for the Y axis can be obtained. By guiding a central position of two edge parts for the Z axis, a reference position for the Z axis can be obtained.

By guiding teaching information about an accurate transporting position in order to cause the arm of the substrate transport device TR2 to access the reference positions obtained for the respective axial directions, a positional shift of the substrate transport device TR2 can be eliminated.

In the same manner, an accurate transporting position for an arm 31a shown in FIG. 2 is taught.

In the case in which the automatic teaching is to be performed by using the jig provided with the optical sensor head as described above, it is necessary to provide a light emitting part for generating a light signal and a light receiving part for receiving a light signal. Moreover, it is also necessary to provide a signal processing part for electrically processing. into a signal, edge information of the detected portion 122 which is obtained by the light receiving part. The light emitting part, the light receiving part and the signal processing part will be referred to as amplifier parts.

When the teaching processing is to be performed, a weight of the arm 31b is increased and the arm 31b is flexed if the amplifier part AMP is provided on the jig 200 or the arm 31b. Even if the teaching processing is performed in such a state that the arm part 31b is flexed, a positional relationship is different from that in such a state that the arm 31b holds the substrate and an accurate transporting position cannot be taught.

Moreover, in the case in which the automatic teaching for a transporting position is to be performed for the hot plate part provided on the upper side of the liquid treating unit of the unit arrangement part MP, the arm 31b enters the heat treating unit in a comparatively high temperature state with the jig 200 held therein. Therefore, countermeasures against a high temperature are also required.

Therefore, the present inventors have proposed a technique in which the amplifier part AMP is provided in the substrate transport device TR2 and the amplifier part AMP and the optical sensor heads 231, 232, 241 and 242 are connected through an optical fiber. In such a technique, the amplifier part AMP is provided in the substrate transport device TR2. Therefore, it is possible to suppress an increase in the weights of the jig 200 and the arms 31a and 31b, thereby preventing the arms 31a and 31b from being flexed. As a result, an edge can be detected accurately and a transporting position can be taught precisely.

However, the arms 31a and 31b serve to be moved forward and backward in a longitudinal direction (the X direction in FIG. 2). Therefore, if the amplifier part AMP is connected to the optical sensor heads 231, 232, 241 and 242 through an optical fiber, the optical fiber is repetitively bent every time the arms 31a and 31b are moved forward and backward. For this reason, there is a possibility that the optical fiber might be deteriorated in a short time, resulting in a reduction in performance of a sensor. Moreover, when the arm 31a and 31b are moved backward, it is necessary to secure a space required for bending the optical fiber. Therefore, a size of the whole substrate processing apparatus is also increased.

The technique according to the present invention is implemented on the premise that the weights of the jig and the arm are reduced so as not to flex the arm when the teaching processing is to be performed automatically and so as not to bend the optical fiber when the arm is moved forward and backward.

3. Jig

Figure 3:
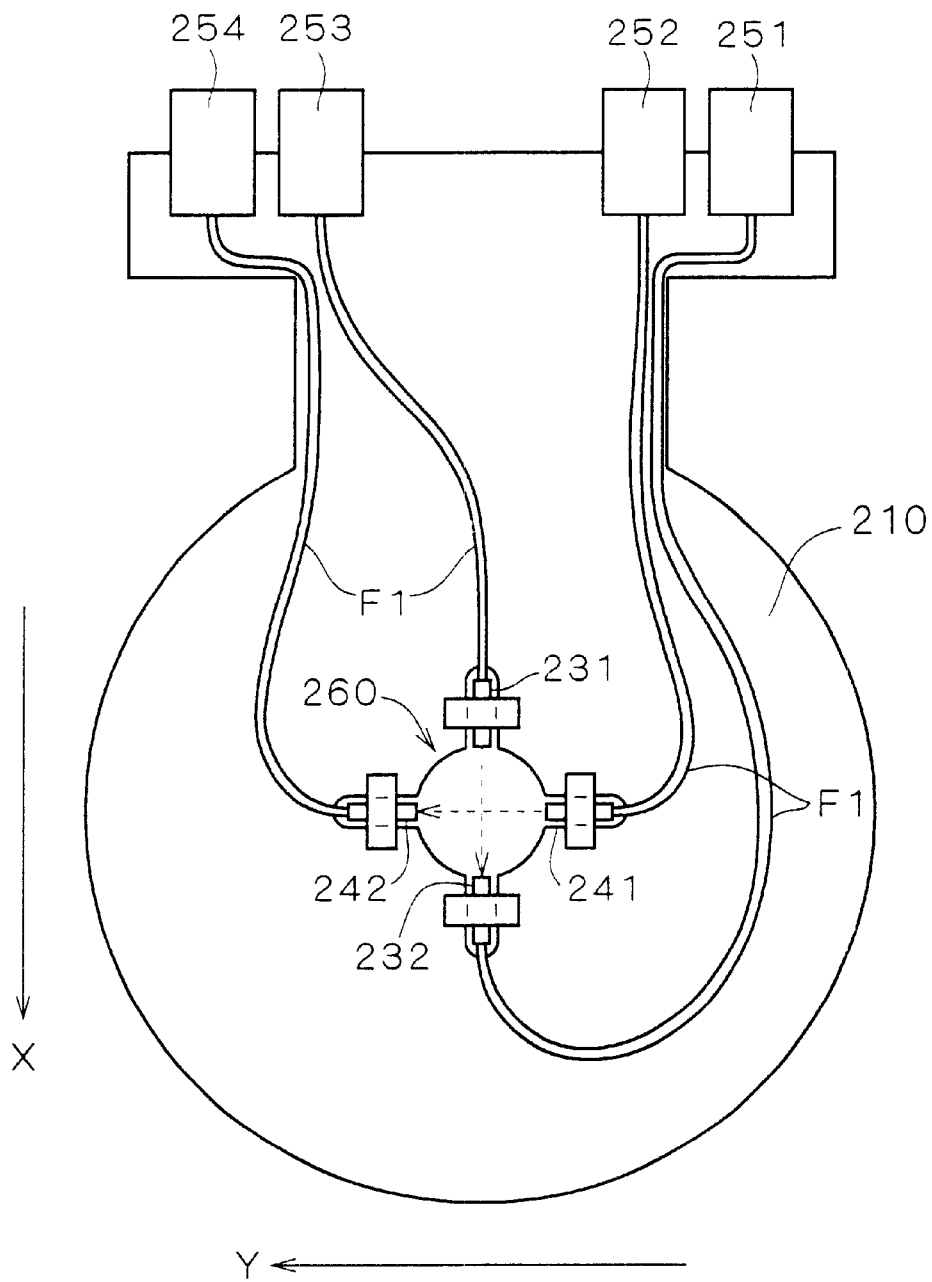
FIG. 3 is a plan view showing a jig for the automatic teaching.

The jig 200 for the automatic teaching of the substrate transport device TR2 according to the present embodiment has a structure shown in FIG. 3. As shown in FIG. 3, the jig 200 h as a body portion 210 capable of being held in the arm of the substrate transport device TR2. A hole 260 is formed in the body portion 210 in order to movably insert the predetermined detected portion 122 (see FIG. 2) provided in the transporting position of an optional processing unit. The optical sensor heads 231, 232, 241 and 242 for detecting an edge part of the detecting portion 122 are provided around the hole 260. As described above, the optical sensor heads 231 and 232 make a set for detecting the detected portion 122 in the Y-axis direction, and the optical sensor heads 241 and 242 make a set for detecting the detected portion 122 in the X-axis direction. An optical fiber F1 is connected and extended from the optical sensor heads in order to transmit a light signal.

Moreover, optical connectors 251, 252, 253 and 254 are fixed to the body portion 210. The optical sensor head 231 and the optical connector 253, the optical sensor head 232 and the optical connector 251, the optical sensor head 241 and the optical connector 252, and the optical sensor head 242 and the optical connector 254 are connected through the optical fiber F1, respectively.

During the teaching processing, a light signal is guided from the optical connectors 253 and 252 through the optical fiber F1, and a light signal is directed from the optical sensor heads 231 and 241, respectively. The light signals directed from the optical sensor heads 231 and 241 are input to the optical sensor heads 232 and 242, and are guided to the optical connectors 251 and 254 through the optical fiber F1, respectively.

In the teaching processing, thus, the light signal is used for detecting, with a non-contact, the predetermined detected portion 122 provided in the transporting position. The amplifier parts such as a light emitting part (that is, a light source) and a light receiving part (that is, a member for converting a light signal into an electric signal) are provided on the substrate transport device TR2 side which will be described below.

Furthermore, a protruded portion which is not shown is provided on a back face of the jig 200. When mounted on the arms 31a and 31b of the substrate transport device TR2, the protruded portion enters forked tip portions 31aa of the arm 31a of the substrate transport device TR2 (see FIG. 2) or forked tip portions 31bb of the arm 31b (see FIG. 2) and abuts on the inside of the tip portions 31aa or 31bb such that a position in a direction of rotation is regulated and determined by the tip portions 31aa or 31bb.

By such a structure, a weight of the jig 200 can be reduced, the arm can be less flexed during the teaching processing and an accurate transporting position can be taught. By using a material having a great heat resistance as the optical fiber F1, moreover, the teaching processing can be normally performed for a heat treating unit set in a high temperature state such as a hot plate part.

In the substrate processing apparatus, furthermore, various chemicals are used for treating the substrate. Since the light signal is transmitted to the jig 200, it is possible to implement the jig 200 having a great explosion-proof property.

4. Substrate Transport Device

Figure 4:
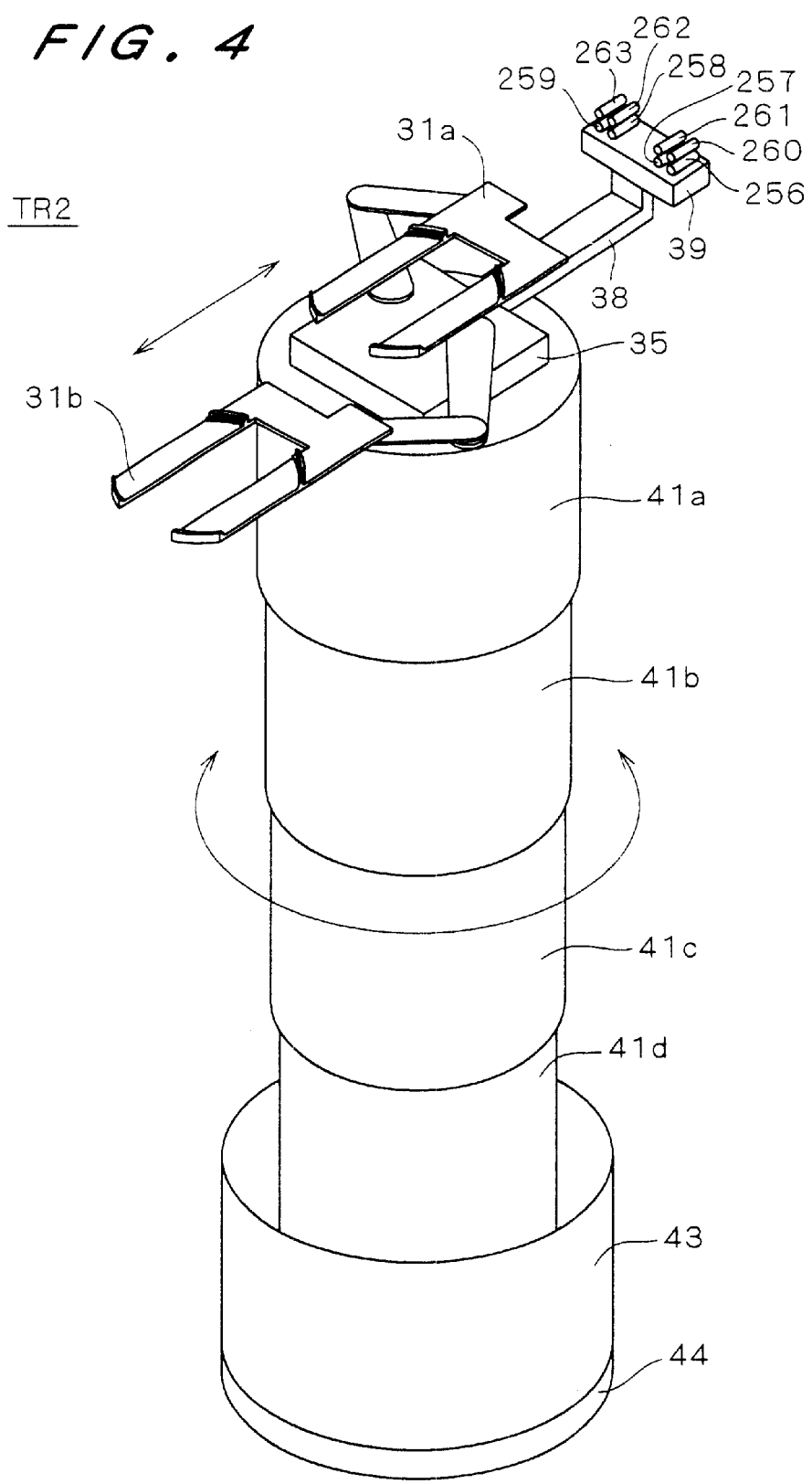
FIG. 4 is a perspective view showing an appearance of a substrate transport device.

Next, a structure of the substrate transport device TR2 will be described. FIG. 4 is a perspective view showing an appearance of the substrate transport device TR2. The substrate transport device TR2 comprises a pair of arms 31a and 31b holding a circular substrate, a horizontal moving mechanism (an X-axis moving mechanism) for independently moving the arms forward and backward in a horizontal direction, an extending and elevating mechanism (a Z-axis moving mechanism) for extending and moving the arms in a vertical direction, and a rotating mechanism (a θ-axis rotating mechanism) for rotating the arms around a vertical axis. By these mechanisms, the arms 31a and 31b can be moved three-dimensionally.

Moreover, a holding table 39 is fixed to an arm support table 35 supporting the arms 31a and 31b through a holding member 38. Eight optical connectors 256, 257, 258, 259, 260, 261, 262 and 263 are arranged in two stages on the holding table 39. The four optical connectors 260, 261, 262 and 263 provided in the upper stage correspond to the arm 31a and the four optical connectors 256, 257, 258 and 259 provided in the lower stage correspond to the arm 31b. An optical fiber is extended from each of the eight optical connectors 256, 257, 258, 259, 260, 261, 262 and 263 into the substrate transport device TR2 (see FIG. 5 which will be described below).

The extending and elevating mechanism of the substrate transport device TR2 of the substrate processing apparatus according to the present embodiment is a so-called telescopic type extending mechanism, and a cover 41d can be accommodated in a cover 41c, the cover 41c can be accommodated in a cover 41b and the cover 41b can be accommodated in a cover 41a. When the arms 31a and 31b are to be brought down, the covers can be accommodated sequentially. To the contrary, when the arms 31a and 31b are to be lifted, the accommodated covers can be sequentially taken out. The vertical direction in which the arms 31a and 31b are moved by the extending and elevating mechanism is set to the Z-axis direction.

The substrate transport device TR2 is provided on a base 44 and the rotating mechanism is constituted such that the substrate transport device TR2 can be rotated by using a center of the base 44 as an axis. The θ axis is used as a center of rotation to be performed by the rotating mechanism. A cover 43 is fixedly attached to the base 44.

Figure 5:
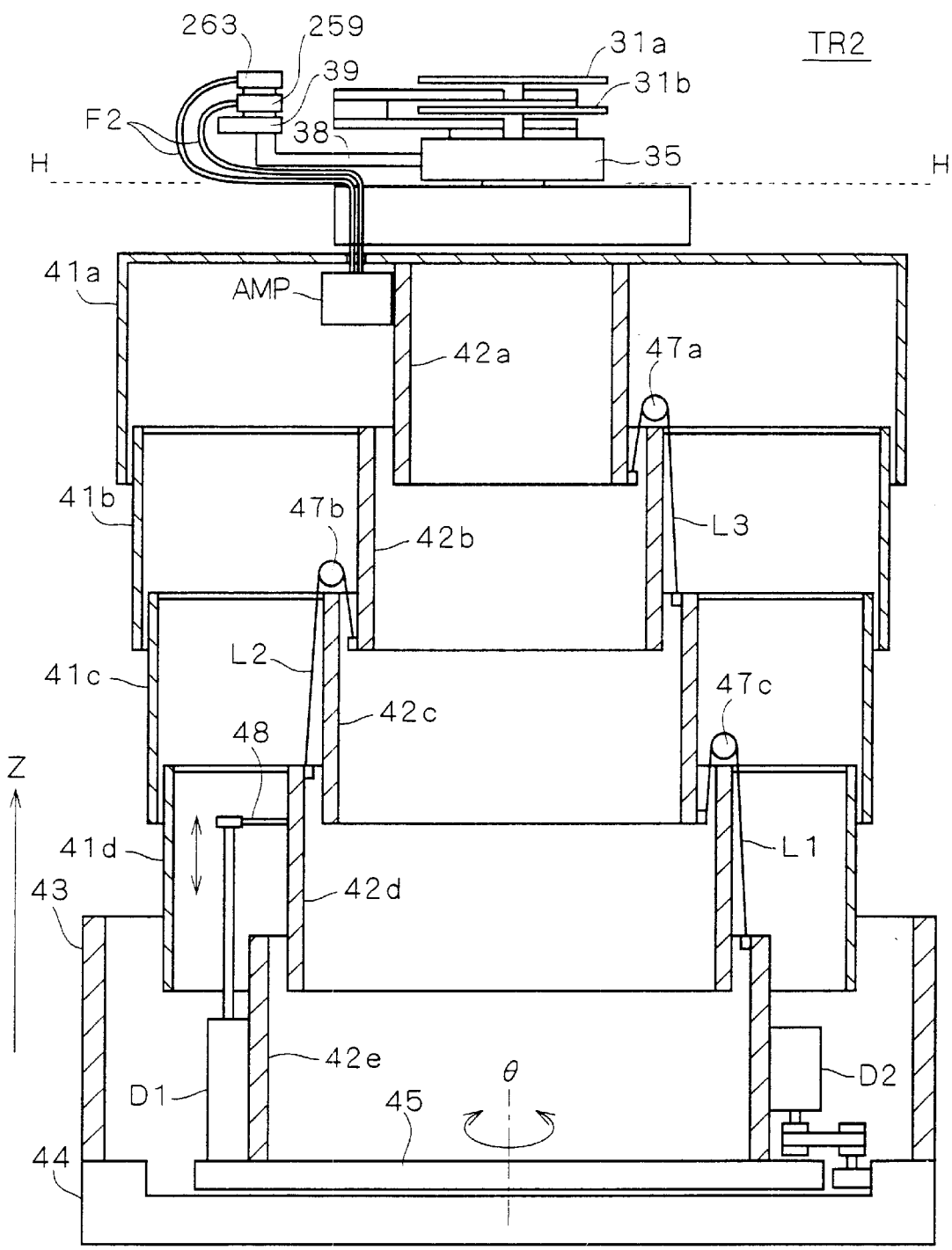
FIG. 5 is a partal side view illustrating an operation of the substrate transport device.

FIG. 5 is a partal side view illustrating an operation of the substrate transport device TR2. A portion provided below a dotted line H in FIG. 5 indicates a body portion of the substrate transport device TR2. As shown in FIG. 5, an optical fiber F2 extended from each of the optical connectors 256, 257, 258, 259, 260, 261, 262 and 263 provided on the holding table 39 is guided into the substrate transport device TR2 and is connected to the amplifier part AMP provided in the substrate transport device TR2. The light emitting part, the light receiving part, the signal processing part and the like are provided in the amplifier part AMP as described above. Accordingly, a light signal (a first light signal) directed from the light emitting part is transmitted to the optical connector through the optical fiber F2, while a light signal (a second light signal) obtained from the optical connector is guided to the light receiving part through the optical fiber F2.

In the present embodiment. thus, the amplifier part AMP is not provided on the arms 31a and 31b. Therefore, the weights of the arms 31a and 31b can be reduced.

As shown in FIG. 5, moreover, the inner portion of the substrate transport device TR2 has a so-called telescopic type multistage insert structure. During contraction, an elevating member 42a is accommodated in an elevating member 42b, the elevating member 42b is accommodated in an elevating member 42c, the elevating member 42c is accommodated in an elevating member 42d, and the elevating member 42d is accommodated in a fixing member 42e.

Pulleys 47a, 47b and 47c are attached to the elevating members 42b, 42c and 42d, respectively. Belts L3, L2 and L1 are provided over the pulleys 47a, 47b and 47c, respectively. The belt L1 has one of ends fixed to an upper portion of the fixing member 42e and the other end fixed to a lower portion of the elevating member 42c. Similarly, the belt L2 is fixed to an upper portion of the elevating member 42d and a lower portion of the elevating member 42b, and the belt L3 is fixed to an upper portion of the elevating member 42c and a lower portion of the elevating member 42a.

When a Z-axis driving part D1 such as a motor which is provided on a rotating table 45 is driven, a support member 48 is lifted or brought down and the elevating member 42d fixedly attached to the support member 48 is lifted or brought down. Description will be given to the case in which the extending and elevating mechanism is extended to lift the arms 31a and 31b. First of all, when the Z-axis driving part D1 performs a driving operation, the support member 48 is lifted and the elevating member 42d is lifted at the same time. When the elevating member 42d is lifted, the pulley 47c attached thereto is simultaneously lifted. As described above, one of the ends of the belt L1 is fixed to the fixing member 42e and the belt L1 has a constant length. Therefore, when the pulley 47c is lifted, the elevating member 42c is lifted through the belt L1. When the elevating member 42c is lifted, the pulley 47b attached thereto is lifted and the elevating member 42b is lifted through the belt L2. When the elevating member 42b is lifted, the pulley 47a attached thereto is lifted and the elevating member 42a is lifted through the belt L3. Thus, the arms 31a and 31b provided on the upper side of the elevating member 42a can be lifted.

Referring to the case in which the arms 31a and 31b are brought down by contracting the substrate transport device TR2 through the extending and elevating mechanism, if the Z-axis driving part D1 performs the driving operation to bring the support member 48 down, the elevating members can be sequentially brought down interlockingly and the arms 31a and 31b provided on the upper side of the elevating member 42a can be brought down.

The covers 41a to 41d are attached to the elevating members 42a to 42d, respectively. The elevating operation of the covers 41a to 41d is interlocked with the operation of the elevating members 42a to 42d.

A θ-axis rotating part D2 is driving means for rotating the rotating table 45 around the axis θ of the base 44, and is constituted by a motor or the like. Accordingly, when the rotating table 45 is rotated around the axis θ, the arms 31a and 31b can be rotated around the axis θ.

Figure 6:
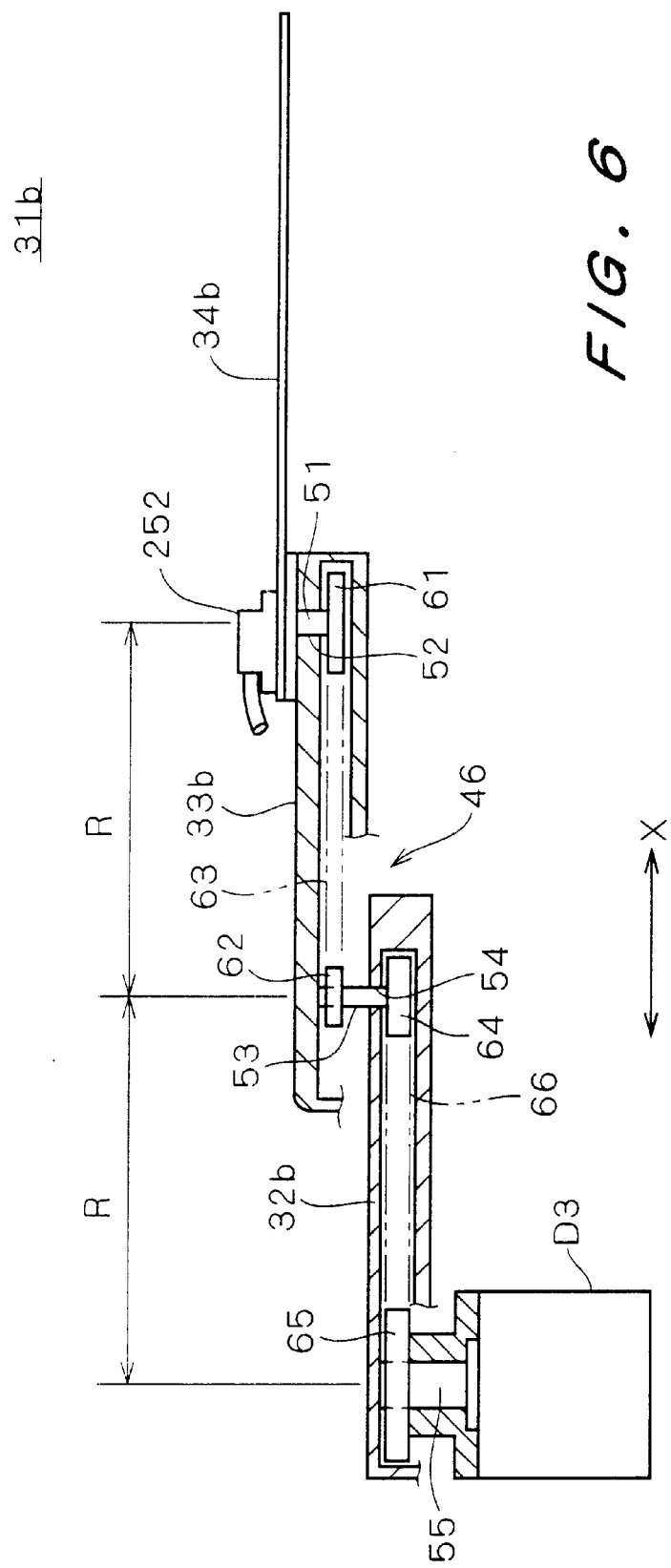
FIG. 6 is a partal side view showing a driving structure of an arm.

Each of the arms 31a and 31b has a structure shown in FIG. 6. FIG. 6 is a partal side view showing a driving structure of the arm 31b. It is apparent that the arm 31a has the same structure. The arm 31b is provided with a first arm segment 34b on the tip side where a substrate W is to be mounted, a second arm segment 33b for rotatably supporting the first arm segment 34b in a horizontal plane, a third arm segment 32b for rotatably supporting the second arm segment 33b in a horizontal plane, an X-axis driving part D3 provided in the arm support table 35 for rotating the third arm segment 32b in a horizontal plane, and power transmitting means 46 to be a bending mechanism for transmitting power to the second arm segment 33b and the first arm segment 34b to control these attitudes and moving directions when the third arm segment 32b is rotated through the X-axis driving part D3.

A first rotating shaft 51 is vertically fixed downward onto a base end of the first arm segment 34b. Moreover, a first bearing hole 52 for rotatably receiving the first rotating shaft 51 is provided in a tip portion of the second arm segment 33b. Furthermore, a second rotating shaft 53 is vertically fixed downward onto a base end of the second arm segment 33b. The third arm segment 32b is set to have the same length as that of the second arm segment 33b, and a second bearing hole 54 for rotatably receiving the second rotating shaft 53 is provided in a tip portion thereof. Moreover, a third rotating shaft 55 to which rotating force of the X-axis driving part D3 is to be transmitted is vertically fixed downward onto a base end of the third arm segment 32b.

The power transmitting means 46 includes a first pulley 61 fixed to a lower end of the first rotating shaft 51, a second pulley 62 fixed to the second rotating shaft 53 on the upper surface side of the second bearing hole 54, a first belt 63 provided between the first pulley 61 and the second pulley 62, a third pulley 64 fixed to a lower end of the second rotating shaft 53, a fourth pulley 65 fixed to the third arm segment 32b for movably fitting the third rotating shaft 55 therein, and a second belt 66 provided between the third pulley 64 and the fourth pulley 65.

A diameter of the first pulley 61 and that of the second pulley 62 are set to have a ratio of 2 to 1, while a diameter of the third pulley 64 and that of the fourth pulley 65 are set to have a ratio of 1 to 2. A distance between the first rotating shaft 51 and the second rotating shaft 53 and a distance between the second rotating shaft 53 and the third rotating shaft 55 are set to have a length R.

When the X-axis driving part D3 rotates the third arm segment 32b counterclockwise by an angle a through the third rotating shaft 55, the second rotating shaft 53 received in the tip portion of the third arm segment 32b is rotated clockwise by a double of the angle of the third rotating shaft 55, that is, $\beta=2\alpha$ through the second belt 66 and the third pulley 64. Consequently, the first rotating shaft 51 received in the tip portion of the second arm segment 33b advances rectilinearly in an X-axis direction. In this case, the rotating angle of the first rotating shaft 51 is controlled through the second pulley 62 and the first belt 63. By using the second arm segment 33b as a reference, the first rotating shaft 51 is rotated counterclockwise by half of the angle of the second rotating shaft 53, that is, $\gamma=\alpha$. However, the second arm segment 33b itself rotates. As a result, the first arm segment 34b advances rectilinearly in the X-axis direction while maintaining an attitude toward the X-axis driving part D3.

Thus, the substrate transport device TR2 includes the horizontal moving mechanism for moving the arms 31a and 31b forward and backward along the X-axis in the horizontal direction, the extending and elevating mechanism for moving the arms 31a and 31b along the Z-axis in the vertical direction, and the rotating mechanism for rotating the arms 31a and 31b around the θ axis. By these mechanisms, the arms 31a and 31b can be moved three-dimensionally, and can transport the substrate W to an optional processing unit with the vicinity of the edge of it supported thereon.

Moreover, the arm support table 35 is fixedly provided on the cover 41a. In other words, the arm support table 35 is fixedly provided in the body portion of the substrate transport device TR2. Accordingly, the holding table 39 fixedly provided on the arm support table 35 is also fixed to the body portion of the substrate transport device TR2, and the eight optical connectors 256, 257, 258, 259, 260, 261, 262 and 263 are also fixed to the body portion of the substrate transport device TR2. Therefore, even if the substrate transport device TR2 performs any moving operation (more specifically, the forward and backward moving operations of the arms 31a and 31b, and the extending and elevating operation and rotating operation of the body portion of the substrate transport device TR2), a relative positional relationship between the eight optical connectors 256, 257, 258, 259, 260, 261, 262 and 263 and the body portion of the substrate transport device TR2 is not changed. As a result, even if the substrate transport device TR2 performs any moving operation, the optical fiber F2 is never bent.

5. Control Mechanism and Operation of Automatic Teaching

Figure 7:
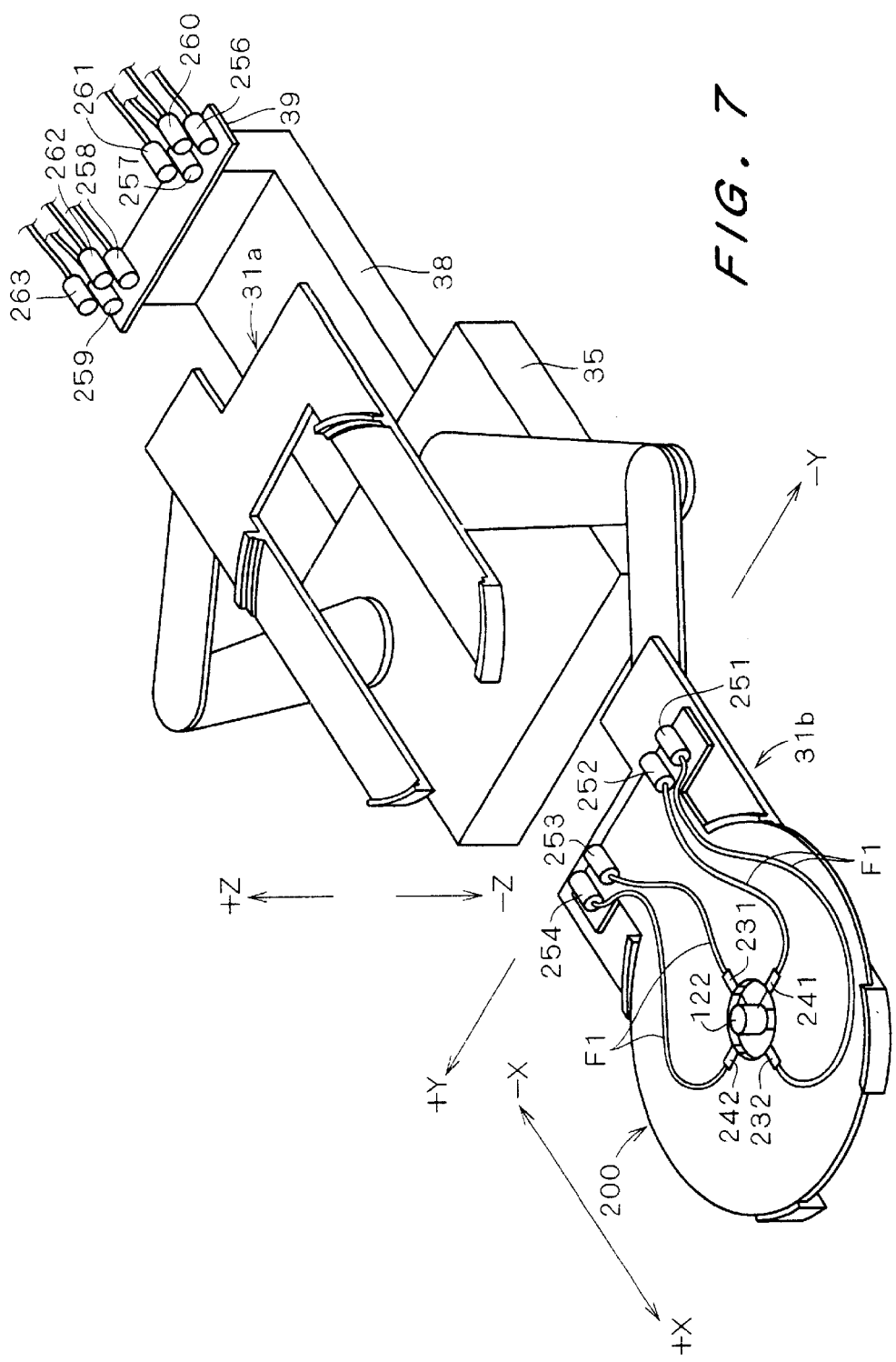
FIG. 7 is a view showing a state in which the jig is set into the arm of the substrate transport device.

With the above-mentioned structure, the jig 200 is set into the arm 31b of the substrate transport device TR2 as shown in FIG. 7, for example, when the automatic teaching of the substrate transport device TR2 is to be performed. As described above, the back face of the jig 200 is provided with the protruded portion for entering the tip portions 31bb of the arm 31b to abut on the inside of the tip portions 31bb. In the setting, therefore, the position of the jig 200 in the direction of rotation with respect to the arm 31b is regulated and determined necessarily in the direction of the rotation when the jig 200 is mounted on the arm 31b.

When the jig 200 is set into the arm 31b as shown in FIG. 7, the optical connectors 256, 257, 258 and 259 of the substrate transport device TR2 are opposed to the optical connectors 251. 252, 253 and 254 of the jig 200 such that their optical axes are coincident with each other.

Figure 8:
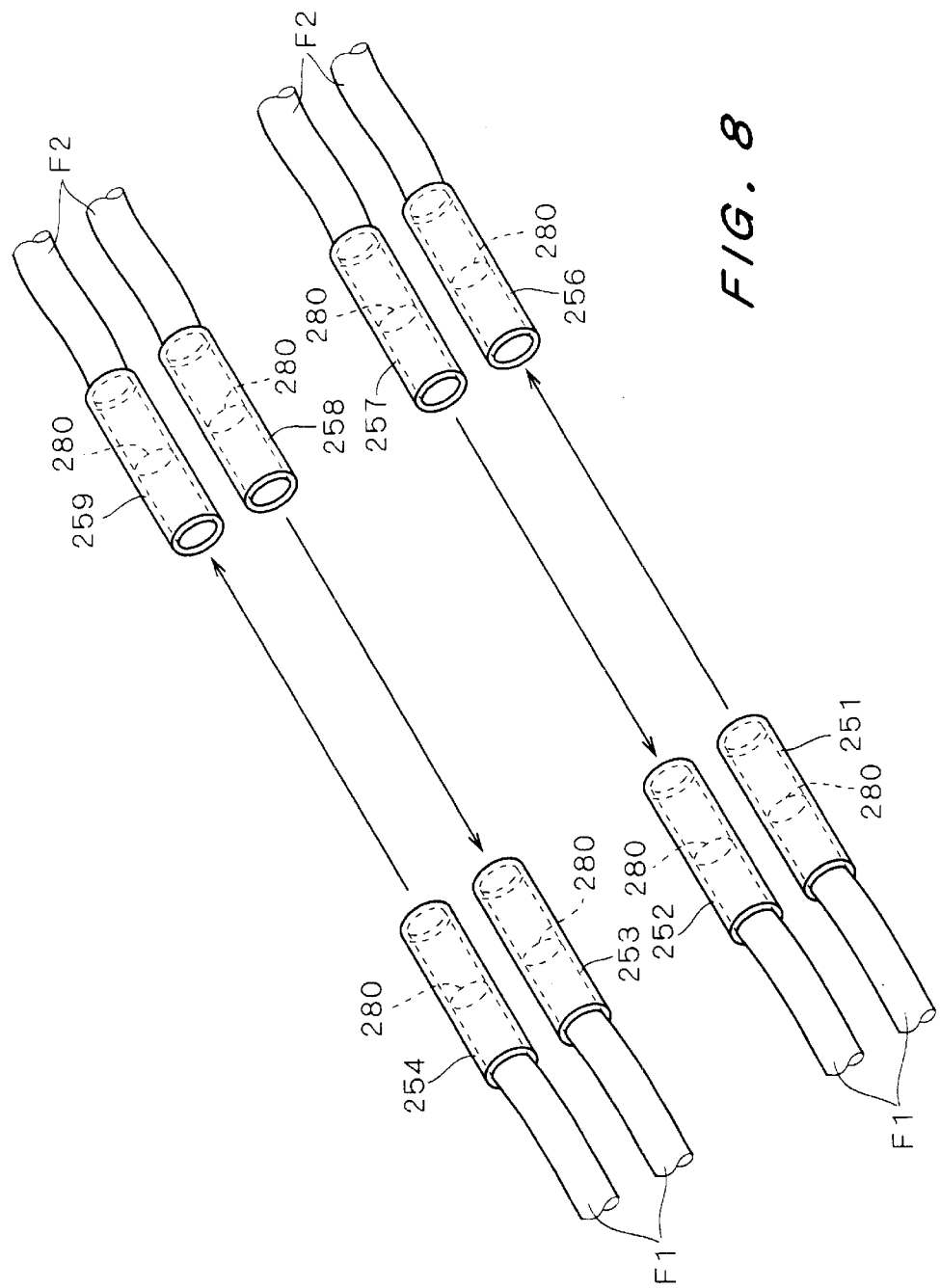
FIG. 8 is a view showing a situation of light transmission between an optical connector of the jig and that of the substrate transport device.

FIG. 8 is a view showing a situation of light transmission between the optical connectors of the jig 200 and those of the substrate transport device TR2. A lens 280 having a high condensation ratio is provided in each of the optical connectors 251, 252, 253 and 254 of the jig 200 and the optical connectors 256, 257, 258 and 259 of the substrate transport device TR2. Accordingly, light emitted from the optical connectors reaches a comparatively distant place without a spread. Accordingly, when the optical connectors 251, 252, 253 and 254 of the jig 200 are opposed to the optical connectors 256, 257, 258 and 259 of the substrate transport device TR2 and their optical axes are coincident with each other, light can be mutually transmitted even if they are provided considerably apart from each other.

The manner of the teaching processing will be described more specifically. The light signal output from the light emitting part of the amplifier part AMP is transmitted to the optical connectors 257 and 258 of the substrate transport device TR2 through the optical fiber F2, and is directed from the optical connectors 257 and 258. The optical connector 252 of the jig 200 is opposed to the optical connector 257 and their optical axes are coincident with each other. Similarly, the optical connector 253 of the jig 200 is opposed to the optical connector 258 and their optical axes are coincident with each other. Moreover, the light emitted from the optical connectors 257 and 258 reaches a comparatively distant place without a spread as described above. Accordingly, the light emitted from the optical connectors 257 and 258 is incident on the optical connectors 252 and 253 without a loss and is received therefrom. The light signal received by the optical connectors 252 and 253 is guided to the optical sensor heads 241 and 231 through the optical fiber F1 respectively, and is emitted therefrom in order to detect the edge part of the detected portion 122.

On the other hand, the light signal which is not shielded by the detected portion 122 but is received by the optical sensor heads 232 and 242 is guided to the optical connectors 251 and 254 through the optical fiber F1 as described above. The optical connector 256 of the substrate transport device TR2 is opposed to the optical connector 251 and their optical axes are coincident with each other. Similarly, the optical connector 259 of the substrate transport device TR2 is opposed to the optical connector 254 and their optical axes are coincident with each other. The light emitted from the optical connectors 251 and 254 reaches a comparatively distant place without a spread. Accordingly, the light emitted from the optical connectors 251 and 254 is incident on the optical connectors 256 and 259 without a loss and is received therefrom. The light signal received by the optical connectors 256 and 259 is transmitted to the light receiving part of the amplifier part AMP through the optical fiber F2 and is converted into an electric signal.

More specifically, the optical connectors 256, 257, 258 and 259 of the substrate transport device TR2 are opposed to the optical connectors 251, 252, 253 and 254 of the jig 200 such that their optical axes are coincident with each other, and the lens 280 having a high condensation ratio is provided in each of the optical connectors. Consequently, the light signal can be transmitted between the optical fiber F1 on the jig 200 side and the optical fiber F2 on the substrate transport device TR2 side. By such a structure, an operator simply mounts the jig 200 on the arm 31b when performing the teaching processing. Thus, the burden of the operator can be lightened. While the case in which the jig 200 is mounted on the arm 31b has been described with reference to FIG. 8, a light signal is similarly transmitted between the optical connectors 251, 252, 253 and 254 of the jig 200 and the optical connectors 260, 261, 262 and 263 of the substrate transport device TR2 even if the jig 200 is mounted on the arm 31a.

Description will be given to a control mechanism for performing the automatic teaching.

Figure 9:
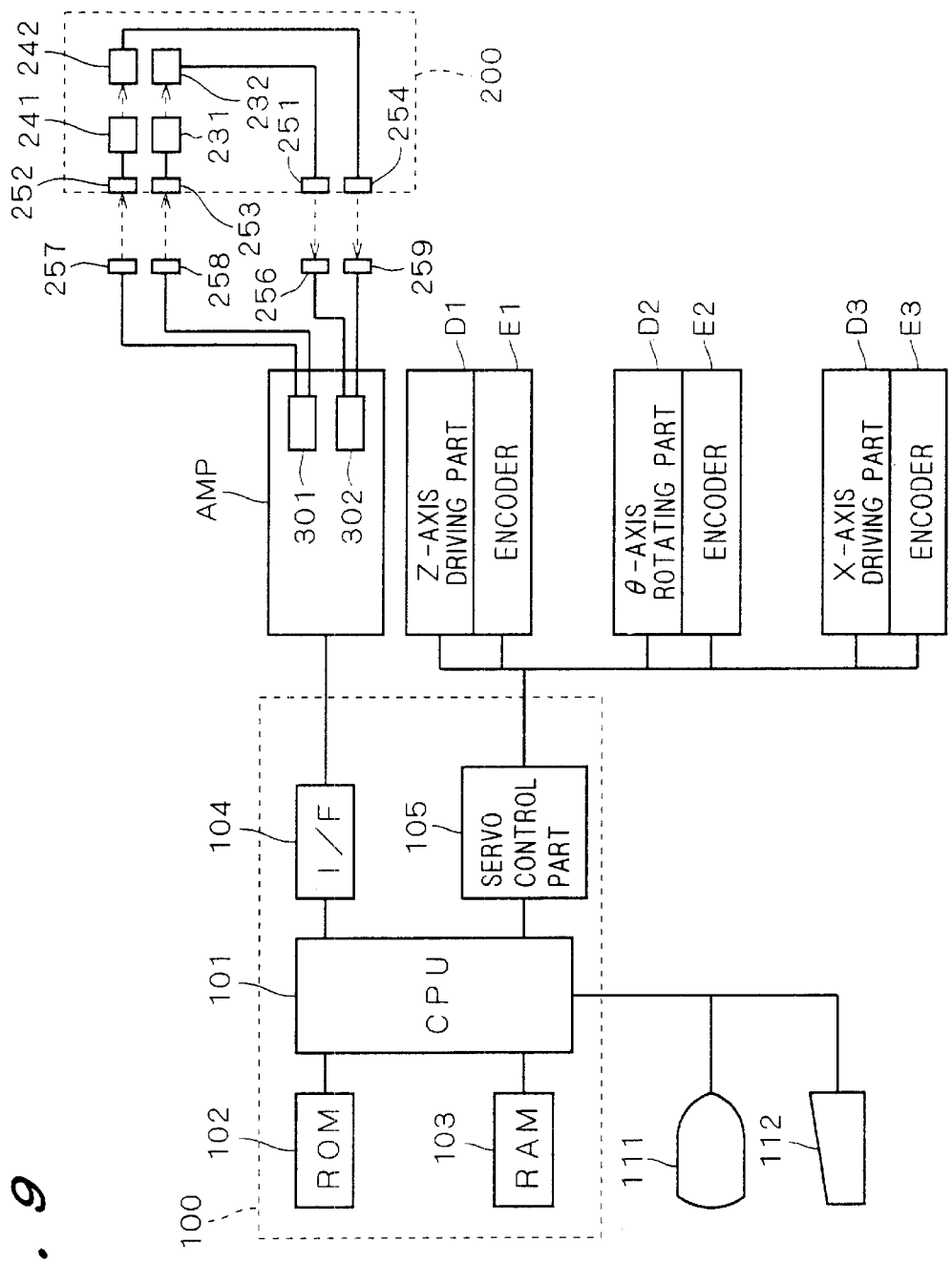
FIG. 9 is a block diagram showing a control mechanism for performing a teaching processing.

FIG. 9 is a block diagram showing a control mechanism for transporting out the teaching processing. FIG. 9 is a block diagram showing the case in which the jig 200 is provided on the arm 31b.

As shown in FIG. 9, a control part 100 includes a CPU 101 for giving a driving instruction to the arms 31a and 31b, an ROM 102 in which a program is written in advance, an RAM 103 for storing a user program, positional information and the like, an interface 104 and a servo control part 105. All of the ROM 102, the RAM 103, the interface 104 and the servo control part 105 are connected to the CPU 101.

The amplifier part AMP provided in the substrate transport device TR2 is connected to the interface 104. When a power source is turned on, a light signal generated from a light emitting part 301 is transmitted to the optical sensor heads 241 and 231 on the jig 200 side through light transmission from the optical connector 257 to the optical connector 252 and light transmission from the optical connector 258 to the optical connector 253. Moreover, the light signals obtained at the optical sensor heads 242 and 232 are transmitted to a light receiving part 302 of the amplifier part AMP through light transmission from the optical connector 254 to the optical connector 259 and light transmission from the optical connector 251 to the optical connector 256, and are converted into electric signals therein. After various signal processings and the like are transport out, the electric signal is transmitted to the CPU 101 through the interface 104.

The servo control part 105 is connected to a Z-axis driving part D1, a θ-axis rotating part D2, an X-axis driving part D3 and encoders E1, E2 and E3. The encoders E1, E2 and E3 are provided to detect the quantities of driving of the Z-axis driving part D1, the θ-axis rotating part D2 and the X-axis driving part D3, respectively. Accordingly, an output of each of the encoders E1, E2 and E3 is obtained through the servo control part 105. Consequently, the CPU 101 can detect a displacement for the operation of the substrate transport device TR2 so that the CPU 101 can obtain the positional information of each arm. Moreover, the CPU 101 can output the quantities of driving of the Z-axis, the θ-axis and the X-axis to the servo control part 105, thereby controlling the driving operation of the substrate transport device TR2.

Moreover, a display part 111 for displaying information for an operator and an operation input part 112 for the operator to input a processing command and the like are connected to the CPU 101.

When the operator specifies the execution of the automatic teaching processing, these control mechanisms are wholly operated as a transport teaching system of the substrate transport device TR2.

As described above, the edge position of the detected portion 122 provided in the transporting position of the predetermined processing unit is detected for the X-axis, the Y-axis and the Z-axis as shown in FIG. 7 and an accurate transporting position is obtained by an operation based on the edge position. The substrate transport device TR2 does not comprise driving means for the Y-axis. Therefore, the θ-axis rotating part D2 is caused to function as driving means for the Y-axis. For example, if the arm 31b is to be moved in a +Y direction, it is assumed that the θ-axis rotating part D2 is moved in a +θ direction. If the arm 31b is to be moved in a −Y direction, it is assumed that the θ-axis rotating part D2 is moved in a −θ direction.

Figure 10:
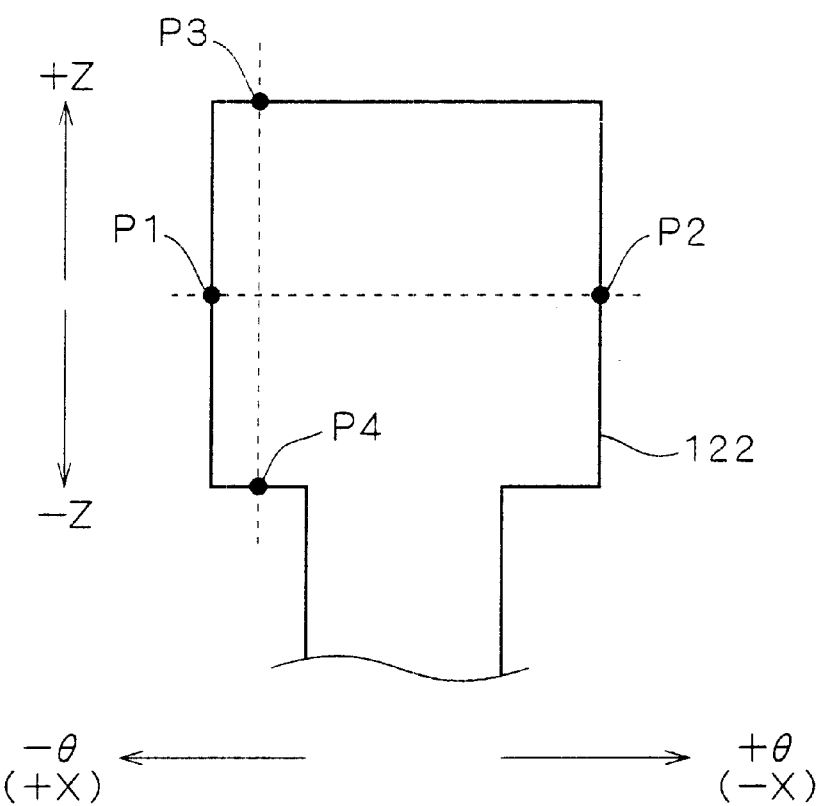
FIG. 10 is a diagram illustrating positional information detected in the automatic teaching.

As shown in FIG. 10, when the arm 31b is moved in the +θ direction or the −θ direction with the jig 200 set thereto, edge positions P1 and P2 in the almost Y direction of the detected portion 122 can be detected by the optical sensor heads 231 and 232. Moreover, when the arm 31b is moved in the +X direction or the −X direction with the jig 200 set thereto, the edge positions P1 and P2 in the X direction of the detected portion 122 can be detected by the optical sensor heads 241 and 242. Furthermore, when the arm 31b is moved in the +Z direction or the −Z direction with the jig 200 set thereto, edge positions P3 and P4 in a vertical direction of the detected portion 122 can be detected by the optical sensor heads 231 and 232 or the optical sensor heads 241 and 242. Teaching information for causing the arm 31b to access a reference position is obtained from positional information about these edge positions. Thus, the automatic teaching is completed.

More specifically, the control part 100 has a function as moving control means for moving the arms 31a and 31b to detect the detected portion 122 provided in the transporting position through the optical sensor heads 231, 232, 241 and 242 in a state in which light is emitted and received between the optical connectors of the jig 200 and those of the substrate transport device TR2, and has a function as teaching information acquiring means for acquiring teaching information about a transporting position from the positional information of the detected portion 122 detected by the optical sensor heads 231, 232, 241 and 242.

While the detected portion 122 has been provided in the optional processing unit to be accessed by the substrate transport device TR2, it may be provided in any configuration in a position to be a center of the transporting position. As an example, the detected portion 122 may be formed in a central position of a jig having almost the same shape as that of the substrate which is different from the jig 200 and the jig may be set into a chuck portion of the substrate of the processing unit. While the jig 200 has been mounted on the arm 31b, it is a matter of course that the jig 200 can also be mounted on the arm 31a in the same manner.

As described above, the structures of the jig and the substrate transport device according to the present embodiment can automatically detect the edge positions of the detected portion 122 for the X-axis, the Y-axis and the Z-axis, and an accurate transporting position can be automatically set based on the positional information about the edge positions thus obtained. Accordingly, the burden of the operator can be lightened and a positional shift can be eliminated accurately and efficiently in a short time.

Also in the case in which the above-mentioned teaching processing is to be carried out, the weights of the jig 200 and the arm 31b or 31a can be reduced because the amplifier part AMP is provided in the substrate transport device TR2. Consequently, it is possible to obtain an effect that the optical sensor head can accurately detect the edge without flexing the arm 31b or 31a during the teaching processing and the transporting position can be taught more accurately than in the case in which the amplifier part is provided on the jig 200 or the arm 31b.

As described in the present embodiment, the amplifier part is provided in the substrate transport device TR2. Consequently, in the case in which the teaching processing is to be performed in a high temperature state of a hot plate part or the like, countermeasures can be taken by causing the optical fiber F1 provided on the jig 200 to have a heat resistant specification. Furthermore, it is also possible to obtain an advantage that the heat resistant specification is not required to the amplifier part because it does not enter the inside of the hot plate part in the high temperature state or the like.

In the substrate processing apparatus, moreover, various chemicals are used for processing the substrate. Even if chemicals having inflammability are used, there is no danger that the chemicals might cause ignition by spark discharge or the like because a light signal is transmitted to the arm 31b or the arm 31a entering the treating unit and an electric signal is not transmitted thereto in the present embodiment.

Furthermore, the optical connectors 256, 257, 258, 259, 260, 261, 262 and 263 are fixedly provided in the body portion of the substrate transport device TR2. Therefore, even if the arms 31a and 31b are moved forward and backward, a relative positional relationship between each optical connector and the body portion of the substrate transport device TR2 is not changed and the optical fiber F2 is not bent. Consequently, the optical fiber F2 can be prevented from being deteriorated due to repetitive bending. Therefore, there is no possibility that performance of a sensor might be deteriorated. In addition, even if the arms 31a and 31b are moved backward, the optical fiber F2 is not bent. Therefore, it is not necessary to secure a space required for the bending. As a result, it is possible to prevent the size of the whole substrate processing apparatus from being increased.

6. Variant

While the automatic teaching of the substrate transport device TR2 has been described above, the present invention can also be applied to the substrate transport device TR1 provided in the indexer ID and the substrate transport device provided in the interface IF. By the provision of the amplifier part in the substrate transport device, the same effects as those described above can be obtained.

While the hole has been formed in the center of the jig 200 and the positional information about the detected portion 122 to be movably inserted in the hole has been detected in the above description, such a detecting manner is not restricted. In the case in which the optical sensor head can detect the predetermined detected portion 122 above or below the body portion 210 of the jig 200, the hole does not need to be provided in the jig 200.

While the invention has been shown and described in detail, the foregoing description is in all aspects illustrative and not restrictive. It is therefore understood that numerous modifications and variations can be devised without departing from the scope of the invention.

What is claimed is:

1. An apparatus for transporting a substrate comprising:
   an arm provided to be moved forward and backward with respect to a body portion of said apparatus and capable of holding a substrate;
   an optical connector for emitting light which is fixedly provided in said apparatus body portion;
   an optical connector for receiving light which is fixedly provided in said apparatus body portion;
   a light emitting part provided in said apparatus body portion for transmitting a first light signal to said optical connector for emitting light;
   a light receiving part provided in said apparatus body portion for receiving a second light signal from said optical connector for receiving light;
   an optical fiber for emitting light which serves to transmit said first light signal between said optical connector for emitting light and said light emitting part; and
   an optical fiber for receiving light which serves to transmit said second light signal between said optical connector for receiving light and said light receiving part.

2. The apparatus according to claim 1, wherein said arm holds a teaching jig for optically detecting a predetermined detected portion provided in a transporting position of said substrate and for teaching said transporting position to said apparatus,
   said optical connector for emitting light emits light to said teaching jig held in said arm; and
   said optical connector for receiving light receives light from said teaching jig held in said arm.

3. The apparatus according to claim 2, wherein said optical connector for emitting light and said optical connector for receiving light are provided on a holding table fixed to said apparatus body portion.

4. A transport teaching system for teaching a transporting position of a substrate, comprising:
   a) a substrate transport device including;
      an arm provided to be moved forward and backward with respect to a body portion of said device and capable of holding a substrate, a first optical connector for emitting light which is fixedly provided in said device body portion, a first optical connector for receiving light which is fixedly provided in said device body portion, a light emitting part provided in said device body portion for transmitting a first light signal to said first optical connector for emitting light, a light receiving part provided in said device body portion for receiving a second light signal from said first optical connector for receiving light, an optical fiber for emitting light which serves to transmit said first light signal between said first optical connector for emitting light and said light emitting part, and an optical fiber for receiving light which serves to transmit said second light signal between said first optical connector for receiving light and said light receiving part, b) a jig capable of being held in said arm including;

an optical sensor head for detecting a predetermined detected portion provided in said transporting position with a non-contact, and a second optical connector for emitting light and a second optical connector for receiving light which are connected to an optical fiber extended from said optical sensor head, c) a moving control part for causing said arm to hold said jig and for moving said arm to detect said detected portion provided in said transporting position through said optical sensor head in a state in which light is emitted and received between said first optical connector for emitting light and said second optical connector for receiving light and between said first optical connector for receiving light and said second optical connector for emitting light; and d) a teaching information acquiring part for acquiring teaching information about said transporting position from positional information about said detected portion detected by said optical sensor head.

5. The transport teaching system according to claim 4, wherein said first optical connector for emitting light and said first optical connector for receiving light in said substrate transport device are provided on a holding table fixed to said device body portion.

6. The transport teaching system according to claim 5, wherein said moving control part causes said optical sensor head to detect an edge of said detected portion, and said teaching information acquiring part acquires teaching information about said transporting position from positional information about said edge of said detected portion.

7. A transport teaching system for teaching a transporting position of a substrate, comprising:

a) a substrate transport device including;

an arm provided to be moved forward and backward with respect to a body portion of said device and capable of holding a substrate, a first optical connector for emitting light which is fixedly provided in said device body portion, a first optical connector for receiving light which is fixedly provided in said device body portion, light emitting means provided in said device body portion for transmitting a first light signal to said first optical connector for emitting light, light receiving means provided in said device body portion for receiving a second light signal from said first optical connector for receiving light, an optical fiber for emitting light which serves to transmit said first light signal between said first optical connector for emitting light and said light emitting means, and an optical fiber for receiving light which serves to transmit said second light signal between said first optical connector for receiving light and said light receiving means, b) a jig capable of being held in said arm including;

optical detecting means for detecting a predetermined detected portion provided in said transporting position with a non-contact, and a second optical connector for emitting light and a second optical connector for receiving light which are connected to an optical fiber extended from said optical detecting means, c) moving control means for causing said a to hold said jig and for moving said arm to detect said detected portion provided in said transporting position through said optical detecting means in a state in which light is emitted and received between said first optical connector for emitting light and said second optical connector for receiving light and between said first optical connector for receiving light and said second optical connector for emitting light; and d) teaching information acquiring means for acquiring teaching information about said transporting position from positional information about said detected portion detected by said optical detecting means.

8. The transport teaching system according to claim 7, wherein said first optical connector for emitting light and said first optical connector for receiving light in said substrate transport device are provided on a holding table fixed to said device body portion.

9. The transport teaching system according to claim 8, wherein said moving control means causes said optical detecting means to detect an edge of said detected portion, and said teaching information acquiring means acquires teaching information about said transporting position from positional information about said edge of said detected portion.

* * * * *